(12) United States Patent
Beaumier et al.

(10) Patent No.: US 7,733,655 B2
(45) Date of Patent: Jun. 8, 2010

(54) LID EDGE CAPPING LOAD

(75) Inventors: Martin Beaumier, Quebec (CA); Mohamed Belazzouz, Quebec (CA); Peter J Brofman, Hopewell Junction, NY (US); David L Edwards, Poughkeepsie, NY (US); Kamal K Sikka, Poughkeepsie, NY (US); Jiantao Zheng, Beacon, NY (US); Jeffrey A Zitz, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 63 days.

(21) Appl. No.: 12/177,195

(22) Filed: Jul. 22, 2008

(65) Prior Publication Data

US 2010/0020503 A1    Jan. 28, 2010

(51) Int. Cl.
*H05K 7/20* (2006.01)
*H01L 23/12* (2006.01)
*H01L 21/00* (2006.01)

(52) U.S. Cl. .................. 361/719; 361/704; 361/707; 361/714; 29/829; 29/832; 156/160; 257/704; 257/706; 257/713; 438/122

(58) Field of Classification Search .......... 361/704, 361/707, 714, 718–719; 165/185; 257/704, 257/706; 438/121–122; 156/160, 291; 29/829, 29/832

See application file for complete search history.

(56) References Cited

U.S. PATENT DOCUMENTS

| | | | |
|---|---|---|---|
| 5,545,473 A * | 8/1996 | Ameen et al. ............. 428/212 |
| 6,333,551 B1 * | 12/2001 | Caletka et al. ............ 257/707 |
| 6,504,723 B1 * | 1/2003 | Fitzgerald et al. ........ 361/705 |
| 6,748,350 B2 * | 6/2004 | Rumer et al. .............. 703/9 |
| 6,828,676 B2 * | 12/2004 | Akai ...................... 257/720 |
| 6,848,172 B2 * | 2/2005 | Fitzgerald et al. ......... 29/825 |
| 6,894,908 B1 * | 5/2005 | Clark et al. ............. 361/825 |
| 6,936,501 B1 * | 8/2005 | Too et al. ................. 438/122 |
| 6,965,171 B1 | 11/2005 | Lee et al. |
| 7,102,226 B2 * | 9/2006 | Fitzgerald et al. .......... 257/712 |
| 7,119,433 B2 | 10/2006 | Corbin, Jr. et al. |
| 7,185,420 B2 * | 3/2007 | Mayer ...................... 29/739 |
| 7,256,058 B2 * | 8/2007 | Fitzgerald et al. ........... 438/15 |
| 7,312,261 B2 | 12/2007 | Sachdev et al. |

(Continued)

*Primary Examiner*—Jayprakash N Gandhi
*Assistant Examiner*—Robert J Hoffberg
(74) *Attorney, Agent, or Firm*—Gibb I.P. Law Firm, LLC

(57) ABSTRACT

A method attaches a semiconductor chip to a substrate, applies a thermal interface material to a top of the semiconductor chip, and positions a lid over the semiconductor chip typically attached to the substrate with an adhesive. The method applies a force near the distal ends of the lid or substrate to cause a center portion of the lid or substrate to bow away from the semiconductor chip and increases the central thickness of the thermal interface material prior to curing. While the center portion of the lid or substrate is bowed away from the semiconductor chip, the thermal interface material method increases the temperature of the assembly, thus curing the thermal interface material and lid adhesive. After the thermal interface material has and adhesive have cured, the method removes the force from near the distal ends of the lid or substrate to cause the center portion of the lid to return to a position closer to the semiconductor chip, creating a residual compressive stress in the thermal interface material thus improving thermal performance and thermal reliability.

16 Claims, 5 Drawing Sheets

U.S. PATENT DOCUMENTS

| | | | |
|---|---|---|---|
| 7,506,795 B2 * | 3/2009 | Mayer | 228/194 |
| 7,513,035 B2 * | 4/2009 | Too et al. | 29/832 |
| 7,616,444 B2 * | 11/2009 | Munch et al. | 361/719 |

* cited by examiner

LID EDGE CAPPING LOAD

BACKGROUND

1. Field of the Embodiments herein

The embodiments of the embodiments herein generally relate to preventing damage to the thermal interface materials that exist between semiconductor chips and lids which are positioned above the chips, and, more particularly, to a structure and method that causes the thermal interface material to have different regions of compression.

2. Description of the Related Art

Integrated circuit structures are commonly formed on wafers which are divided into chips. These chips are usually mounted on substrates and are connected to cooling mechanisms using items such as thermal pastes. One issue that arises with such structures relates to moisture or temperature-induced thermal degradation in the thermal interface material (TIM) that is usually positioned between the chip and the overlying cap or lid. This moisture or temperature thermal degradation prevents reliable low-temperature operation of the electronic package throughout its field life.

For example, such structures can suffer from a moisture induced shape flattening mechanism. The initial die curvature of a chip depends on the laminate, underfill material and its curing conditions. Because of such curvature, the thermal interface material can tear during the curing process. This tearing can occur differently at the center relative to more manageable tears that may occur in the ends (corners and edges) of the thermal interface material. For example, with lower keff (effective thermal conductivity) TIMs, tears can occur at the center of the TIM, while higher keff TIMs usually experienced tears in the corners of the TIM.

Further, temperature and humidity can cause die flattening. Die flattening causes the TIM to stretch, which further decreases keff at center and also causes thermal performance degradation. Other variables which can induce similar issues include laminate warpage, choice of encapsulation cure conditions (cure temperature and stree-free temperature (T-ref) for seal adhesive and Thermal Interface Material) and Lid/laminate surface condition (seal adhesion; gel adhesion and integrity).

SUMMARY

In order to address the foregoing issues, one method embodiment of the embodiments herein attaches a semiconductor chip to a substrate, applies a thermal interface material (TIM) to the top of the semiconductor chip, and positions a lid over the semiconductor chip. Further, during assembly the method applies a force to distal ends of the lid to cause a center portion of the lid to bow away from the semiconductor chip. While the center portion of the lid is bowed away from the semiconductor chip, the temperature of the assembly is increased in this position thus allowing the seal and thermal TIM to cure into a solid or gel-like material. After the thermal interface material has cured, the method removes the force from the distal ends of the lid to cause the center portion of the lid to return to a position closer to the semiconductor chip.

This process produces a structure that comprises a semiconductor chip on a substrate, a thermal interface material on the semiconductor chip, and a lid on the thermal interface material. In some embodiments, the lid can be bowed. The center portion of the thermal interface material comprises more compressive stress relative to compressive stress at the end portions of the thermal interface material.

These and other aspects of the embodiments of the embodiments herein will be better appreciated and understood when considered in conjunction with the following description and the accompanying drawings. It should be understood, however, that the following descriptions, while indicating embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION OF EMBODIMENTS

Figure 1:
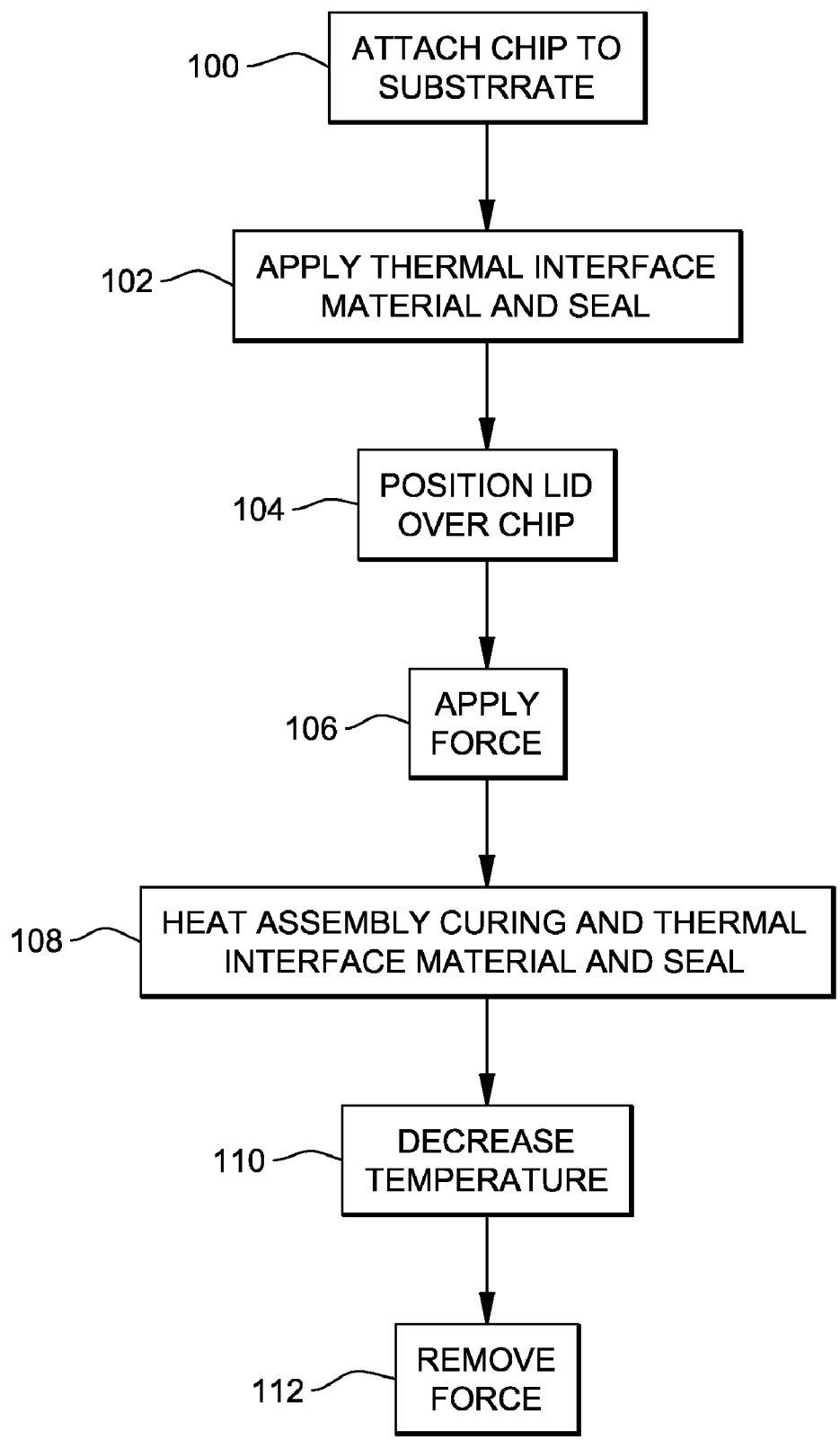
FIG. 1 is a flow diagram illustrating a method embodiment herein.

The embodiments herein and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

One problem solved by the embodiments herein deals with the thermal degradation of a chip-cap thermal interface material (TIM) in an electronic package. The details regarding methods, materials and processes used in the formation of substrates, chips, caps, lids, thermal interface materials, etc. is well known to those ordinarily skilled in the art in such matters are not discussed in detail herein. For example, teachings of such items are disclosed in U.S. Pat. Nos. 7,312,261; 7,119,433; and 6,965,171, the complete disclosures of which are incorporated herein by reference.

The mechanism of degradation is related to a tensile strain generated in the TIM as a result of a moisture and/or temperature induced flattening of the chip and laminate substrate. One idea of the embodiments herein deals with changing the fixturing and clamping of the electronic package during its assembly. By generating an edge load on the package lid, a pre-compression is generated in the TIM over the operating temperature range which offsets the moisture and/or temperature induced tensile strain and shape flattening. With an edge loading approach, the TIM center also sees a lower TIM center tensile strain during high-temperature ball grid array input/output (BGA I/O) and card join reflows when compared to a center loading approach. One advantage of this structure and method is its ability to offset the moisture or temperature-induced thermal degradation in the TIM, allowing reliable low-temperature operation of the electronic package throughout its field life.

More specifically, as shown in flowchart form in FIG. 1, a method embodiment herein attaches a semiconductor chip to a substrate in item 100. In item 102 the method applies a thermal interface material to a top of the semiconductor chip or to the interior of the lid and a lid attach material (seal) adhesive 216 to the lid 206 seal band or chip carrier periphery 214. Then, in item 104, the method positions a lid over the semiconductor chip.

Figure 4:
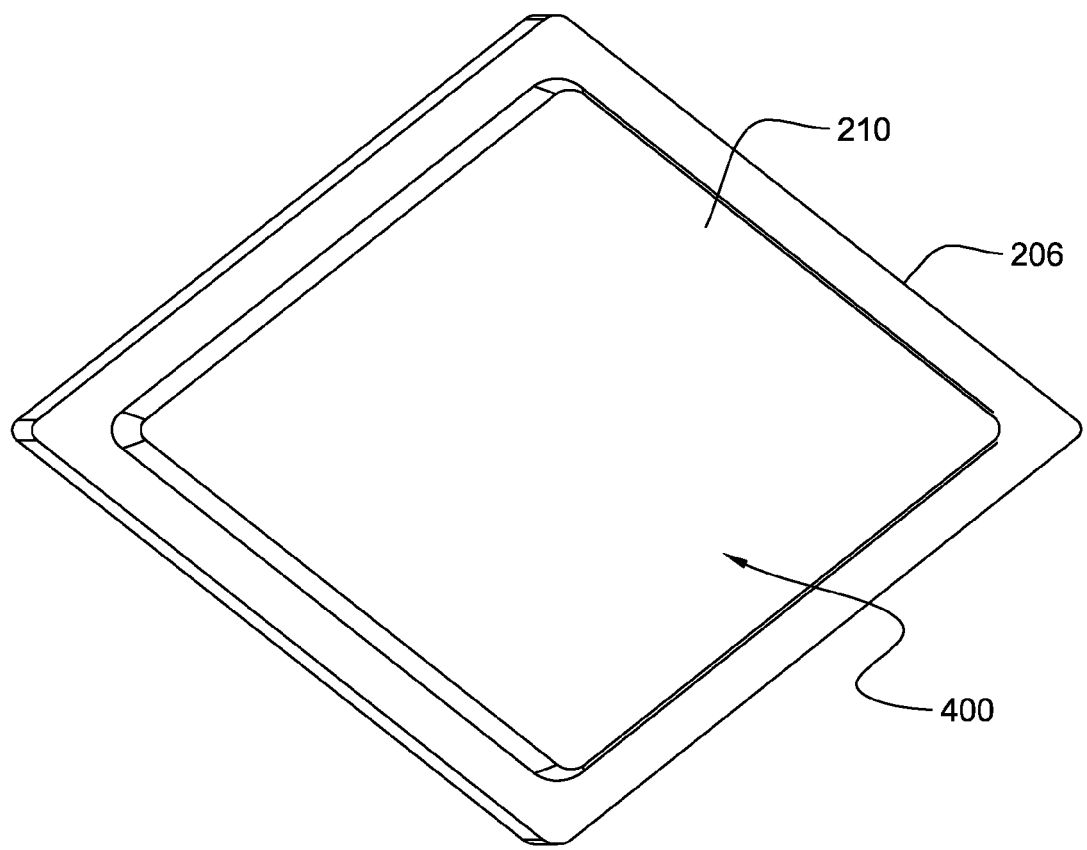
FIG. 4 is a perspective schematic drawing of a lid structure according to embodiments herein.

Generally, the lid 206 used is a flat slug of copper that has a cavity 400 (FIG. 4) on one side, as shown as item 206 in FIG. 4. The rim 210 outside the cavity forms the surface which seals to the laminate 214 through the use of a seal adhesive 216. To a lesser extent, a "picture-frame" stiffener can be adhered to the laminate and then a flat plate lid (no cavity) could form a similar structure. The seal adhesive 216 is generally a wet-dispensed adhesive such as Sylgard 577, EA6700 or EA6900 all produced by Dow Corning (Midland, Mich., USA). A bead is dispensed on the laminate or lid rim and it wets both mating surfaces upon initial assembly of the parts, and occurs in item 102.

Further, the method applies a force to distal ends of the lid to cause a center portion of the lid to bow away from the semiconductor chip in item 106.

The lid bending force could be applied anywhere off-center from the lid. Locating the force at the edge or corners would be the outermost extreme and provide the most bending with the least force. A combination of force location and force magnitude allows the engineer to "dial-in" the exact amount of bending desired.

During the process prior to cure, the lid is bent slightly forming a "plate-spring". The rim of the lid moves toward the laminate once the force is applied squeezing out the seal slightly and decreasing the seal thickness by the amount of the bending. For example, when "wet-assembled" with no force, the seal thickness is ~200 um. When the force is applied, the lid bends in a convex-up fashion and the seal (still in its pre-cured wet state) squeezes down to 150 um with the excess seal adhesive moving to form a slightly wider seal, or into a fillet. During this step 106, the slightly thicker TIM1 302 at the center of the chip is formed (see FIG. 3A).

In item 108, the method cures the structure by increasing the temperature of the structure and, more specifically, of the thermal interface material and seal. For example, the temperature can be increased from 20° C. to 250° C. or higher (generally 100° C.-200° C. and 125° C. is typical). While the center portion of the lid is still bowed away from the semiconductor chip, the method decreases the temperature of the structure and, more specifically, of the thermal interface material and seal in item 110 (e.g., to below 125° C., or down to 20° C.). After the thermal interface material and seal have has cured, and then in item 112, the method removes the force from the distal ends of the lid to cause the center portion of the lid to return to a position closer to the semiconductor chip (FIG. 3b).

Upon unloading the assembly fixture, the sprung lid will try to re-assume its original flatter shape thus pulling upwards on the now-cured seal and laminate periphery which then provides a reaction force at the lid center compressing the TIM1 and silicon chip. Because the TIM1 is cured with a thicker central section and this residual force exists compressing the lid to the chip (thus continually squeezing the TIM1), the package becomes very resistance to any thermal degradation caused by subsequent stresses such as 1) flattening of the chip by humidity or temperature aging, 2) high temperature card join (at Pb-Free temperatures of 260° C.), 3) thermal or power cycling, 4) thermal shock or 5) impact shock and vibration (shipping-related stresses). Thus, the "fight" between tensile stress in the seal and compressive stress in the TIM1 is critical to the stability of the package.

Figure 2A:
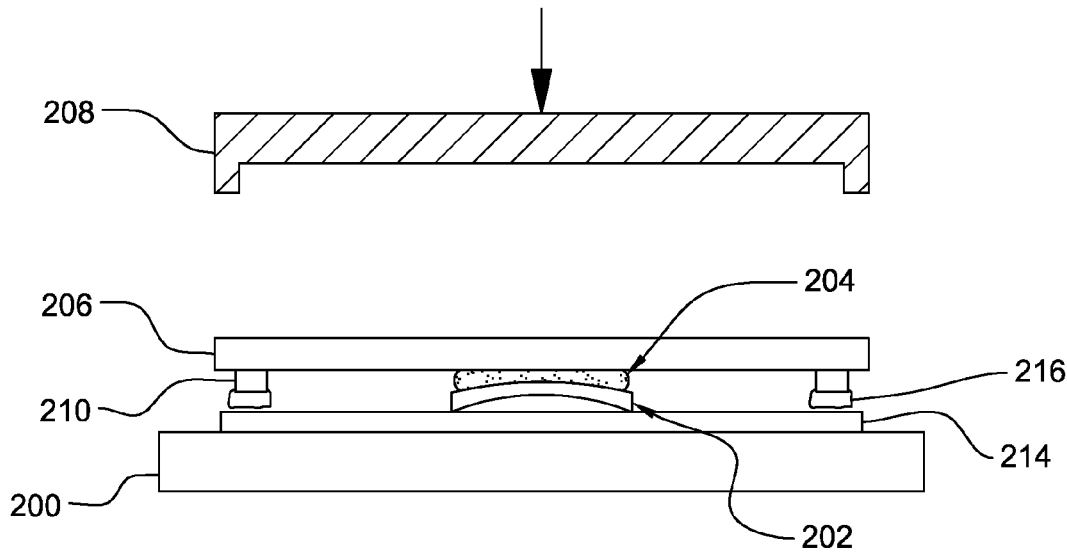
FIG. 2A-2E are schematic cross-sectional diagrams of different processing stages of an integrated circuit chip/lid structure.

Such a process is also shown schematically in FIGS. 2A-2E. More specifically, as shown in FIG. 2A, a semiconductor chip 202 is attached to a substrate 200 and a thermal interface material 204 is applied to the top of the semiconductor chip 202. Further, a lid 206 is positioned over the semiconductor chip 202. The lid 206 used is a flat slug of copper that has a cavity 400 on one side as shown in item 206 in FIG. 4. The rim 210 outside the cavity forms the surface which seals to the laminate 214 through use of a seal adhesive 216. The schematic drawing shown in FIG. 2A, illustrates a gimbaled fixture 208 that has not yet been applied to the lid 206 and therefore the lid 206 is substantially linear and is not bowed.

Figure 2B:
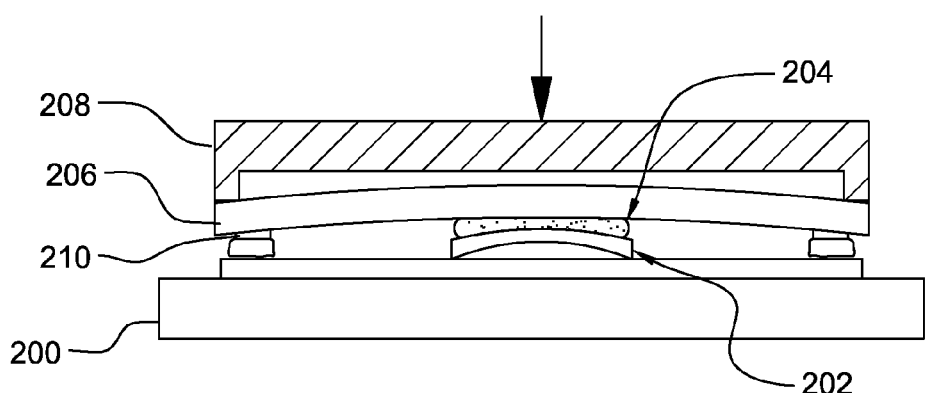

In FIG. 2B, the method applies a force to distal ends of the lid 206 using the gimbaled fixture 208 to cause a center portion of the lid 206 to bow away from the semiconductor chip 202. This application of force bends the lid 206 over the semiconductor chip 202 by applying a force outside the edge of the semiconductor chip 202 relative to a center of the lid 206. Thus, by utilizing the gimbaled 208 fixture to apply the force only to distal ends of the lid 206, the center of the lid 206 moves away from the thermal interface material 204.

Figure 2C:
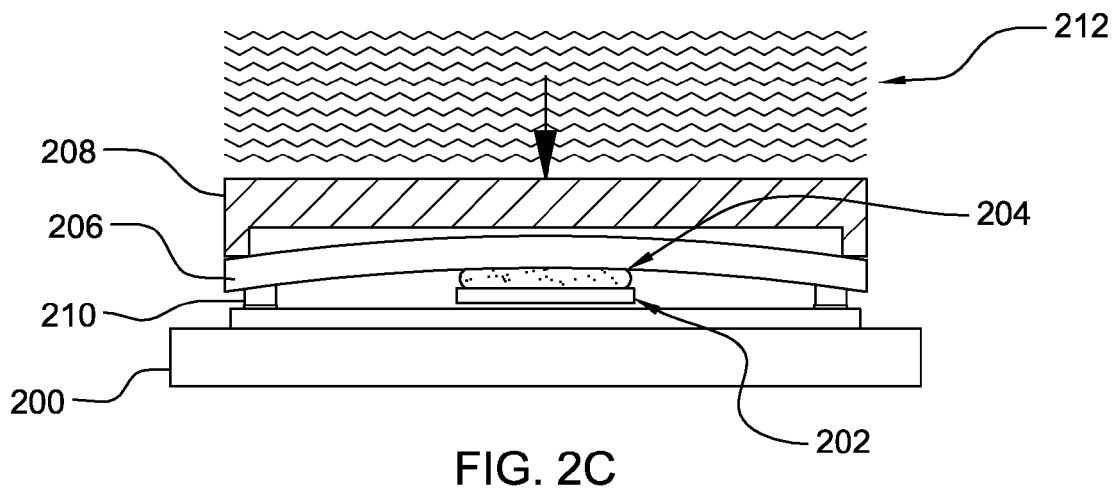
Figure 2D:
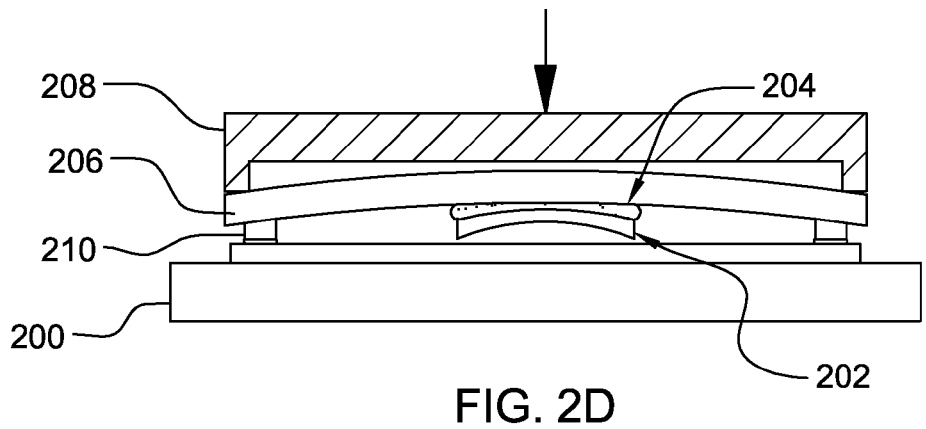

In FIG. 2C, heat 212 is applied to the assembly to cure the structure by increasing the temperature of the thermal interface material 204 and seal adhesive 216. Then, as shown in FIG. 2D, while the center portion of the lid 206 is still bowed away from the semiconductor chip 202, the method decreases the temperature of the thermal interface material 204. Upon cooling, the silicon chip will assume a convex-up shape due to the difference in CTE's between the silicon, laminate and the stiff connection between the two provided by the underfill.

Figure 2E:
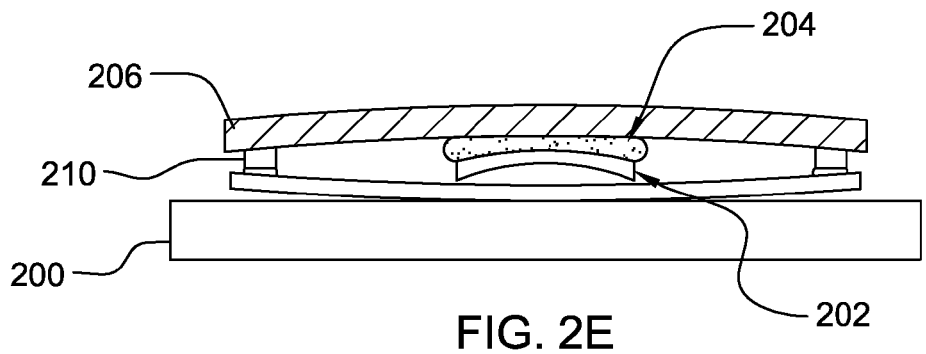

Finally, as shown in FIG. 2E, after the assembly has cooled, the method removes the gimbaled fixture 208 to remove the force from the distal ends of the lid 206 to elastically cause the center portion of the lid 206 to return to a position closer to the semiconductor chip 202. A similar effect can be attained by applying the gimbaled fixture 208 to substrate edges 214 while restraining lid with a substantially flat fixture base 200. As shown in greater detail in FIGS. 3A and 3B (which contains some what exaggerated proportions to illustrate the operation of the invention), this process of removing of the force from the ends of the lid 206 causes the center portion 302 of the thermal interface material 204 to have more compressive stress relative to compressive stress at the end portions 300 of the thermal interface material 204.

Figure 3A:
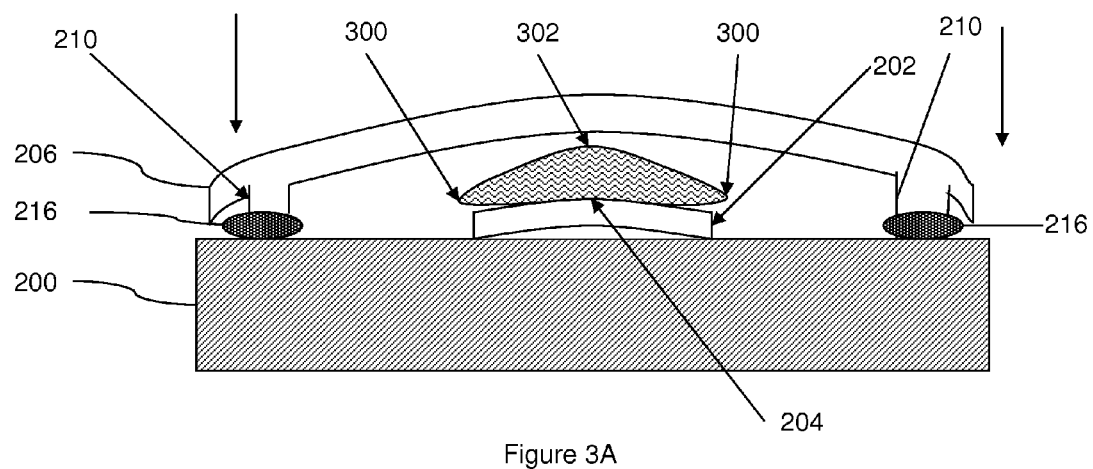
FIG. 3A-3B are schematic cross-sectional diagrams of different processing stages of an integrated circuit chip/lid structure.
Figure 3B:
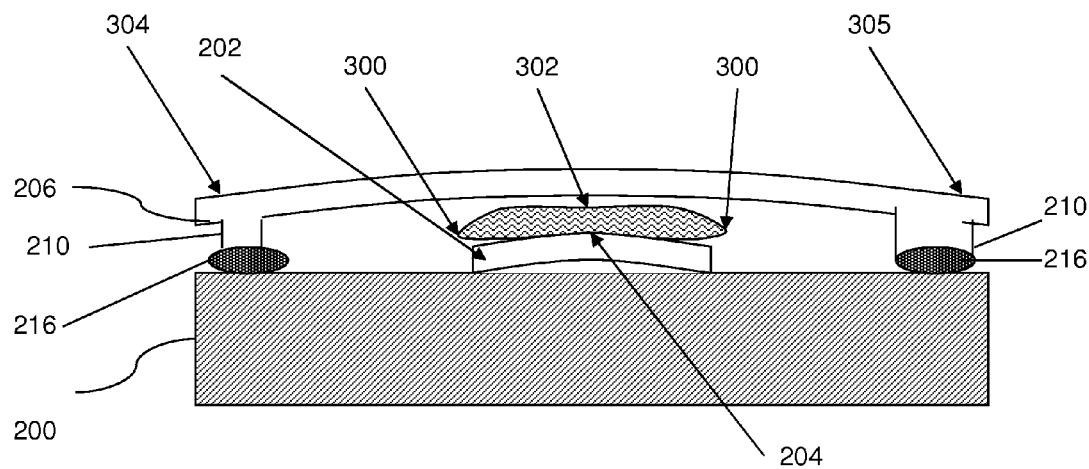

In other words, the thermal interface material 204 shown in FIG. 3A has a substantially uniform compression along its entire length. However, when the forces are removed from the ends of the lid 206, and the center portion of the lid 206 presses down against the already cured thermal interface material 204 as shown in FIG. 3B, the thermal interface material 204 does not spread out further (because it is already cured) and, instead, the center portion 302 compresses a greater amount than the end portions 300 compress creating a difference in compression between the center portion 302 and the distal and portions 300. In other words, by removing of the force, the embodiments herein cause the center portion 302 of the thermal interface material 204 to be more compressed relative to the end portions of the thermal interface material 204. Further, this process can also be said to cause the center portion 302 of the thermal interface material 204 to apply more force against the lid 206 relative to force against the lid 206 applied by the end portions 300 of the thermal interface material 204. Generally, the entire thermal interface material 204 remains in compression while the seal adhesive 216 assumes a state of tension as a reaction once the gimbaled fixture 208 is removed.

In some embodiments, as illustrated in FIGS. 2E and 3B, the lid 206 may maintain a somewhat more shallow or reduced bow shape after the force is removed. This reduced bow shape is more of a bow shape than the original linear lid illustrated in FIG. 2A; however it is less bowed than a bow that occurs when the force is applied to the lid 206 as shown in FIG. 3A.

This process produces the structure shown in FIG. 3B that includes the semiconductor chip 202 on the chip carrier 214, the thermal interface material 204 on the semiconductor chip 202, and the lid 206 on the thermal interface material 204. As mentioned above, in some embodiments, the lid 206 can be bowed. As mentioned above, the center portion 302 of the thermal interface material 204 comprises more compressive stress relative to compressive stress at the end portions 300 of the thermal interface material 204. Because the center portion 302 of the thermal interface material 204 is compressed by the lid 206, the center portion of the thermal interface material 204 has more material per available space in the gap (between chip 202 and the lid 206 that is filled by the thermal interface material 204) relative to the material per available space in the gap of the end portions of the thermal interface material 204. Thus, even though the gap may be somewhat inconsistent, because the center portion 302 is compressed, it can become slightly more dense than the end apportions 300 of the thermal interface material 204. Note that in this structure, the lid 206 is larger than the semiconductor chip 202. Further, in the final structure, the portions of the lid 206 that are distal to semiconductor chip 202, and are contacted by the gimbaled fixture 208 can maintain permanent compression marks where the lid 206 was contacted by the gimbaled fixture (where the lid 206 was bent over the semiconductor chip 202. These marks are illustrated in FIG. 3B as items 304 and 305, and can be on either side of the lid 206. This lid edge loading approach enables a thicker TIM center. This generates a preferentially compressed TIM center bondline at temperatures lower than the curing temperature, which is typically within the operating usage range. This prevents the lid 206 from separating from the semiconductor chip 202 and the TIM 300, 302 from tearing during chip flattening that, as mentioned above, can be caused by increased moisture and temperature. This also generates a lower TIM center strain at high temperature reflow conditions.

Therefore, as shown above, the method attaches a semiconductor chip to a substrate, applies a thermal interface material to a top of the semiconductor chip, and positions a lid over the semiconductor chip that is attached to the substrate with an adhesive. The method applies a force near the distal ends of the lid to cause a center portion of the lid to bow away from the semiconductor chip and increases the central thickness of the thermal interface material prior to curing. While the center portion of the lid is bowed away from the semiconductor chip, the method increases the temperature of the assembly, thus curing the thermal interface material and lid adhesive. After the thermal interface material has and adhesive have cured, the method removes the force from near the distal ends of the lid to cause the center portion of the lid to return to a position closer to the semiconductor chip, creating a residual compressive stress in the thermal interface material thus improving thermal performance and thermal reliability.

Alternatively, similar effect can be attained by applying the gimbaled fixture to substrate edges while restraining lid with a substantially flat fixture base. This method attaches a semiconductor chip to a substrate, applies a thermal interface material to a top of the semiconductor chip, and positions a lid over the semiconductor chip that is attached to the substrate with an adhesive. The method applies a force near the distal ends of the substrate to cause a center portion of the substrate and semiconductor chip to bow away from the lid and increases the central thickness of the thermal interface material prior to curing. While the center portion of the substrate and semiconductor chip is bowed away from the semiconductor chip, the method increases the temperature of the assembly, thus curing the thermal interface material and lid adhesive. After the thermal interface material has and adhesive have cured, the method removes the force from near the distal ends of the substrate to cause the center portion of the substrate and semiconductor chip to return to a position closer to the lid, creating a residual compressive stress in the thermal interface material thus improving thermal performance and thermal reliability The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the embodiments herein have been described in terms of preferred embodiments, those skilled in the art will recognize that the embodiments of the embodiments herein can be practiced with modification within the spirit and scope of the appended claims.

What is claimed is:

1. A structure comprising:
a substrate;
a semiconductor chip on said substrate;
a thermal interface material on said semiconductor chip; and
a lid on said thermal interface material, and attached to said substrate with an adhesive;
said thermal interface material having a center portion and end portions distal to said center portion,
said center portion of said thermal interface material comprising more compressive stress relative to compressive stress at said end portions of said thermal interface material; and
said lid comprising portions distal to said semiconductor chip, said portions distal to said semiconductor chip comprising compression marks of said lid being bent over said semiconductor chip from a force being outside of a projected area of said semiconductor chip relative to a center of said lid on either surface of said lid.

2. The structure according to claim 1, said center portion of said thermal interface material being more compressed relative to said end portions of said thermal interface material.

3. The structure according to claim 1, said center portion of said thermal interface material applying more force against said lid relative to force against said lid applied by said end portions of said thermal interface material.

4. The structure according to claim 1, further comprising a gap between said lid and said semiconductor chip, said thermal interface material filling said gap, said center portion of said thermal interface material comprising morn material per available space in said gap relative to material per available space in said gap of said end portions of said thermal interface material.

5. The structure according to claim 4, said gap being inconsistent along a length of said semiconductor chip.

6. The structure according to claim 1, said lid being larger than said semiconductor chip.

7. A structure comprising:
   a substrate;
   a semiconductor chip on said substrate;
   a thermal interface material on said semiconductor chip; and
   a lid on said thermal interface material, and attached to said substrate with an adhesive;
   said lid being bowed, said thermal interface material having a center portion and end portions distal to said center portion,
   said center portion of said thermal interface material comprising more compressive stress relative to compressive stress at said end portions of said thermal interface material; and
   said lid comprising portions distal to said semiconductor chip, said portions distal to said semiconductor chip comprising compression marks of said lid being bent over said semiconductor chip from a force being outside of a projected area of said semiconductor chip relative to a center of said lid on either surface of said lid.

8. The structure according to claim 7, said center portion of said thermal interface material being more compressed relative to said end portions of said thermal interface material.

9. The structure according to claim 7, said center portion of said thermal interface material applying more force against said lid relative to force against said lid applied by said end portions of said thermal interface material.

10. The structure according to claim 7, further comprising a gap between said lid and said semiconductor chip, said thermal interface material filling said gap, said center portion of said thermal interface material comprising more material per available space in said gap relative to material per available space in said gap of said end portions of said thermal interface material.

11. The structure according to claim 10, said gap being inconsistent along a length of said semiconductor chip.

12. A method comprising:
    attaching a semiconductor chip to a substrate;
    applying a thermal interface material to a top of said semiconductor chip;
    positioning a lid over said semiconductor chip, said positioning of said lid over said semiconductor chip comprising connecting said lid to said semiconductor chip only using said thermal interface material;
    applying an adhesive to connect said lid to areas of said substrate outside said semiconductor chip;
    applying force to distal ends of said lid to cause a center portion of said lid to bow away from said semiconductor chip, said applying of said force comprising bending said lid being over said semiconductor chip by applying a force outside of a projected area of said semiconductor chip relative to a center of said lid;
    increasing a temperature of said thermal interface material and said adhesive to begin a curing process;
    while said center portion of said lid is bowed away from said semiconductor chip, decreasing a temperature of said thermal interface material and adhesive to complete said curing process; and
    after said thermal interface material has cured, removing said force from said distal ends of said lid to cause said center portion of said lid to return to a position closer to said semiconductor chip, said removing of said force causing said center portion of said thermal interface material to have more compressive stress relative to compressive stress at said end portions of said thermal interface material.

13. The method according to claim 12, said applying of said force comprising utilizing a gimbaled fixture to apply said force only to areas of said lid distal to said semiconductor chip.

14. The method according to claim 12, said removing of said force causing said center portion of said thermal interface material to be more compressed relative to said end portions of said thermal interface material.

15. The method according to claim 12, said removing of said force causing said center portion of said thermal interface material to apply more force against said lid relative to force against said lid applied by said end portions of said thermal interface material.

16. The method according to claim 12, said lid maintaining a reduced bow shape after said removing of said force, said reduced bow shape being less bowed than a bow that occurs when said force is applied to said lid.

\* \* \* \* \*